United States Patent [19]

Smith

[11] 4,292,595
[45] Sep. 29, 1981

[54] CAPACITANCE COUPLED ISOLATION AMPLIFIER AND METHOD

[75] Inventor: Lewis R. Smith, Tucson, Ariz.

[73] Assignee: Burr-Brown Research Corporation, Tucson, Ariz.

[21] Appl. No.: 93,918

[22] Filed: Nov. 13, 1979

[51] Int. Cl.³ .............................................. H03F 3/38
[52] U.S. Cl. ....................................... 330/10; 330/252; 330/297
[58] Field of Search ................... 330/251; 207 A, 297, 330/10, 202, 252, 69; 375/22

[56] References Cited
U.S. PATENT DOCUMENTS
4,178,556  12/1979  Attwood .............................. 330/251

Primary Examiner—James B. Mullins
Assistant Examiner—Gene Wan
Attorney, Agent, or Firm—Cahill, Sutton & Thomas

[57] ABSTRACT

An isolation amplifier includes an electrically floating comparator having inputs coupled to inputs of the isolation amplifier. Operating power is supplied to the isolation amplifier by an electrically floating rectifier circuit. A triangular waveform generator produces a triangular output signal which is combined by means of a first coupling capacitor with a differential input signal applied to the inputs of the isolation amplifier. A second coupling capacitor couples the triangular waveform to the floating rectifier circuit. The floating comparator circuit produces a pulse width modulated output signal representative of the magnitude of the differential input signal. A demodulator circuit inverts the pulse width modulated signal to an analog output signal which is an amplified replica of the differential input signal. The analog output signal is electrically isolated from the differential input signal.

16 Claims, 15 Drawing Figures

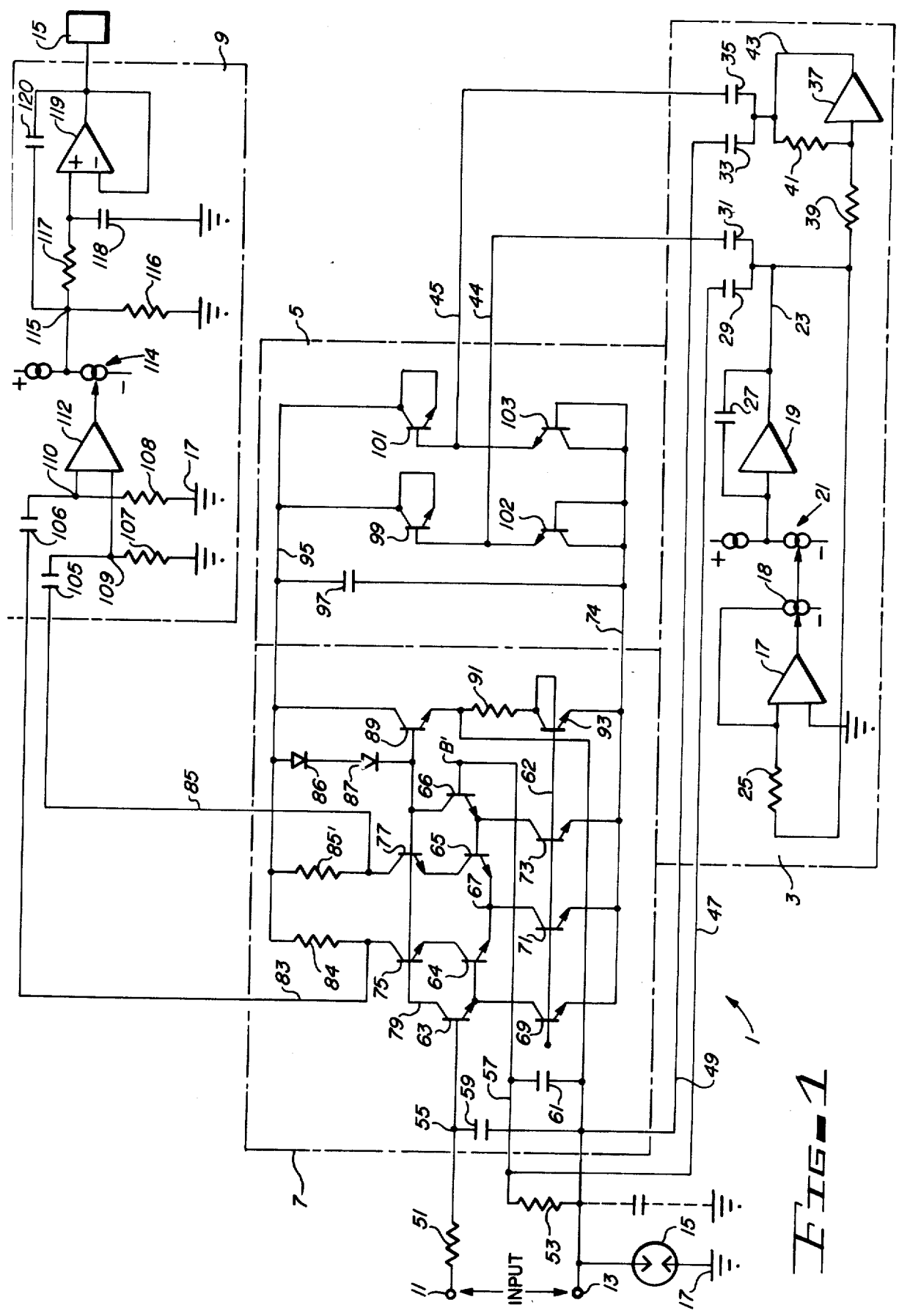

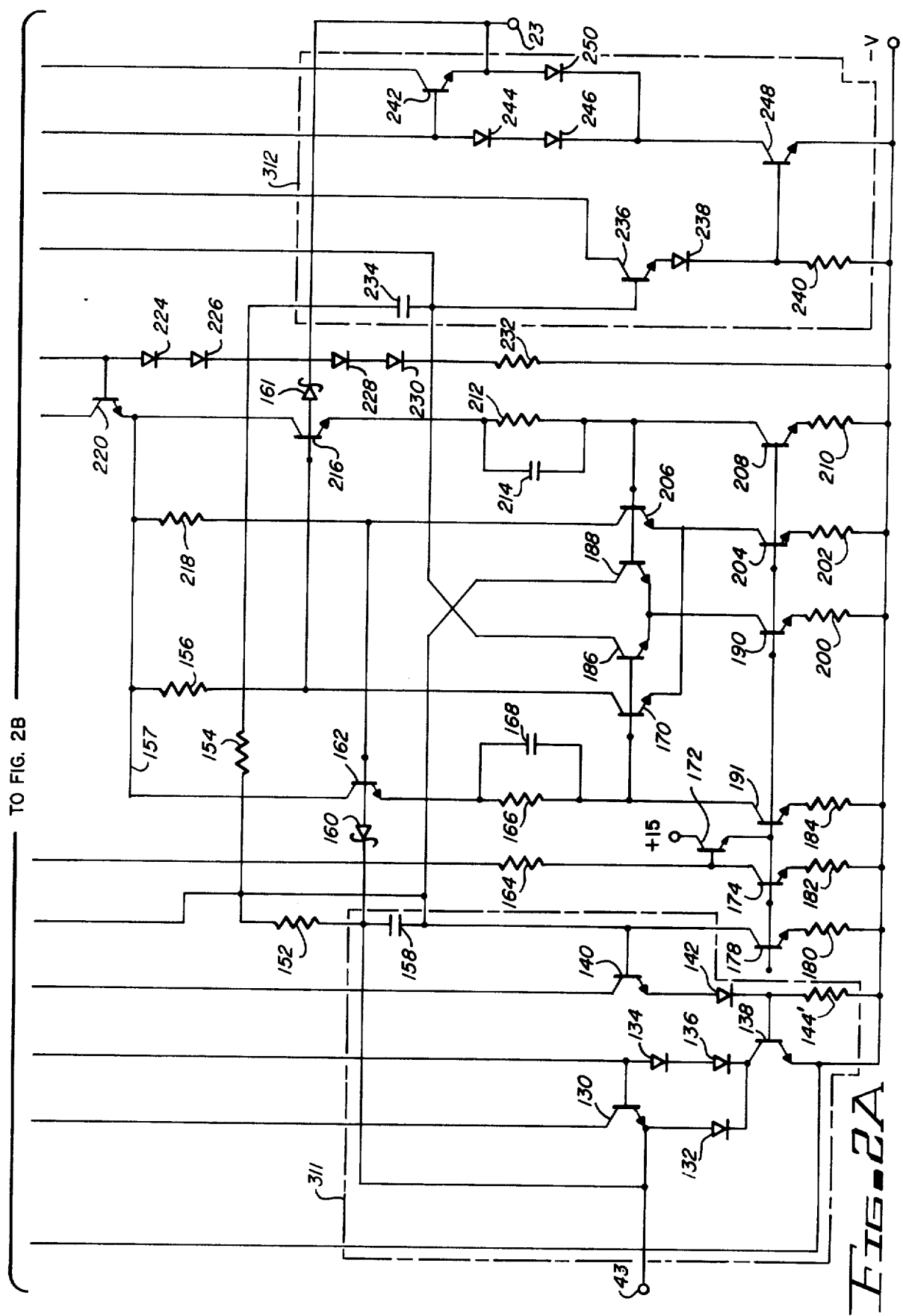

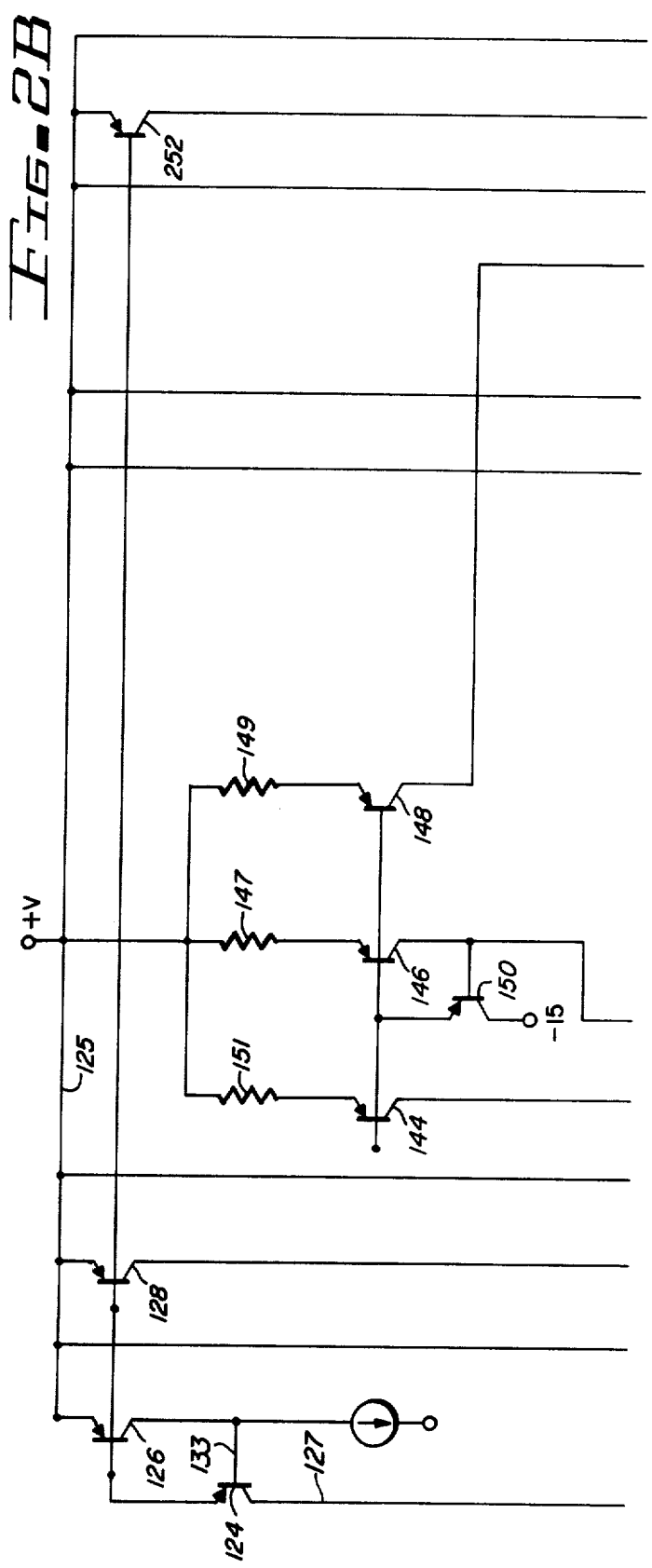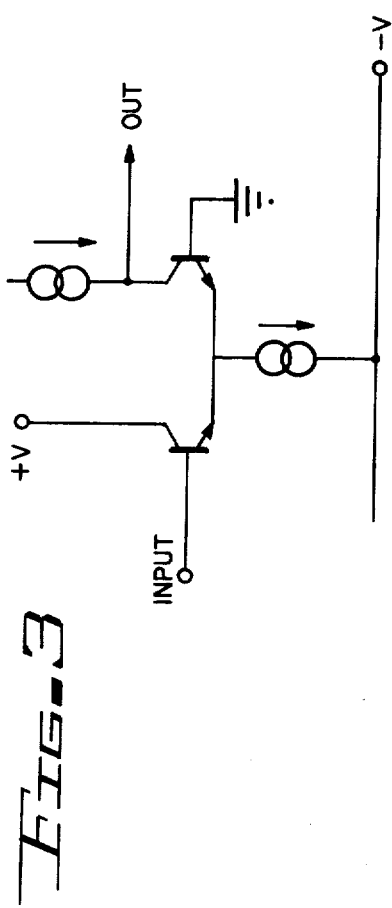

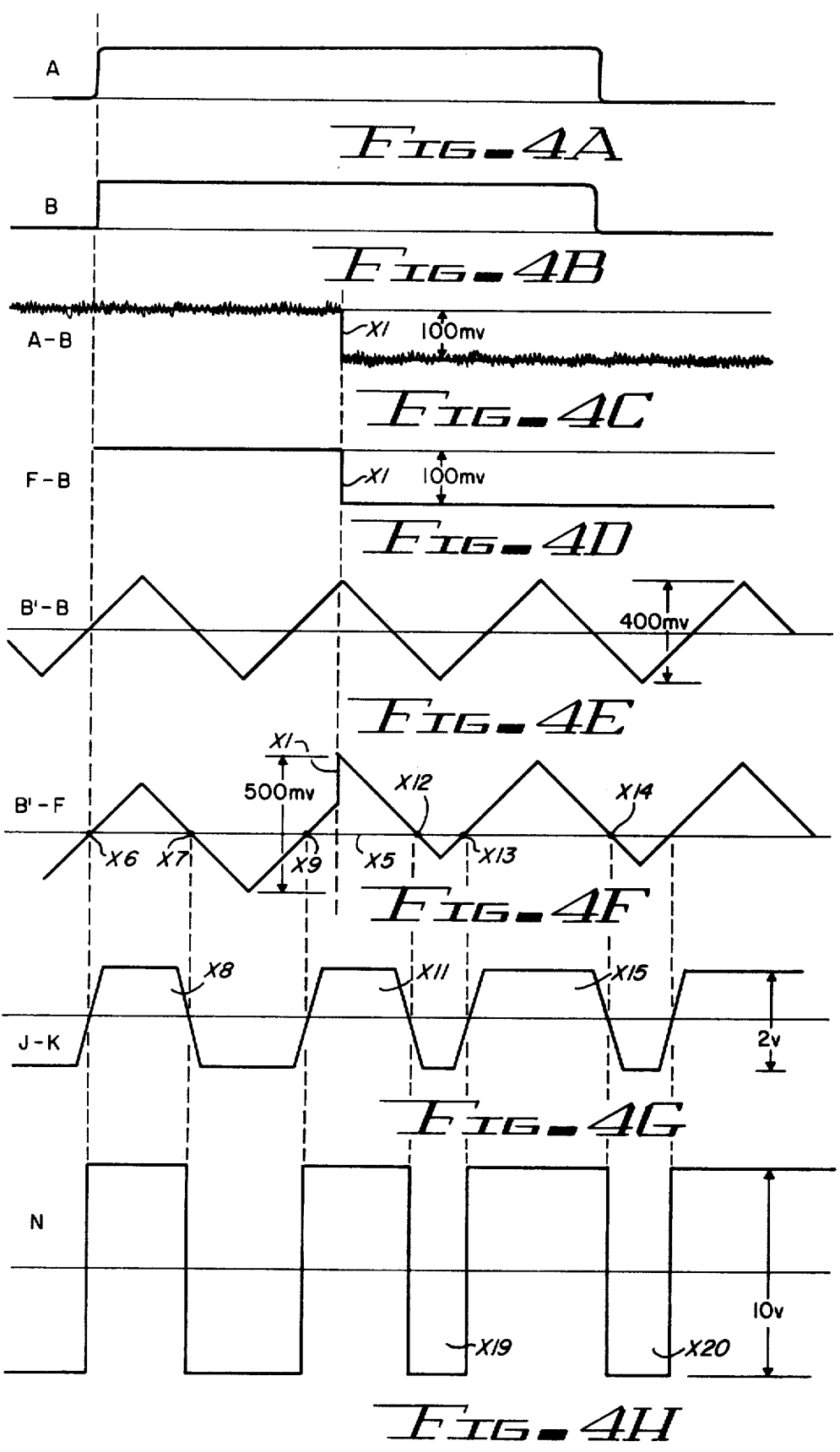

CAPACITANCE COUPLED ISOLATION AMPLIFIER AND METHOD

BACKGROUND OF THE INVENTION

1. Field of the Invention

The invention relates to isolation amplifiers, and particularly to isolation amplifiers having a very high degree of isolation of the output from the input and having very high signal to noise ratio.

2. Description of the Prior Art

Isolation amplifiers have been developed for various applications wherein greater isolation between amplifier inputs and outputs is required than is available for conventional instrumentation amplifiers and differential DC amplifiers. Isolation amplifiers are widely used in the medical electronics field for applications wherein it is often necessary that there be an absolute minimum of conductive paths from inputs of the amplifiers to their outputs. For example, in many medical electronics applications it is desirable that no more than roughly ten to twenty microamps be coupled from an amplifier input to its output. The main type of coupling path existing between an input and an output of a present state-of-the-art isolation amplifier is a capacitive coupling, which may be of the order of 20 picofarads.

A number of different types of isolation amplifiers are commonly used, including transformer coupled isolation amplifiers, optically coupled isolation amplifiers and pulse width modulation (PWM) isolation amplifiers. All of these types of isolation amplifiers have the shortcoming that they are very expensive and can only be utilized in applications wherein it is imperative that a high degree is isolation be maintained between an isolation amplifier outputs and inputs. However, there are many other areas wherein isolation amplifiers could be widely utilized if they were less expensive than they presently are. One technique presently utilized where low cost is essential to provide a high level of isolation between a data source circuit and a data utilization circuit is referred to as the "flying capacitor" technique. In accordance with the flying capacitor technique, reed relays coupled to form a double pole, double throw switch are first activated to connect a capacitor to the data source circuit, which charges up a capacitor. The reed relays are then switched to disconnect the charged capacitor from the source circuit and to connect the capacitor to a data utilization circuit. A typical cost figure for implementation of the flying capacitor technique is approximately $10.00 per data channel. The technique suffers the shortcomings that reed relay systems are slow, bulky, unreliable, and frequently cause deterioration due to varying resistances of the reed relay contacts. Thus, there is a presently unmet need for a low cost, highly reliable isolation amplifier.

Accordingly, it is an object of this invention to provide a highly reliable, low cost isolation amplifier which overcomes the shortcomings of the flying capacitor isolation technique.

A major factor contributing to the high cost of the above mentioned prior art isolation amplifiers is that they require expensive, electrically floating power supplies capable of delivering a substantial amount of current. Such power supplies alone add at least roughly $20.00 to the cost of present state of the art isolation amplifiers.

Accordingly, it is another object of the invention to provide a low cost, highly reliable isolation amplifier which includes a power supply system which is much less expensive than power supply systems for prior art isolation amplifiers.

It has been found that certain types of electronic analog equipment can sometimes produce erroneous signals when the equipment is utilized in the presence of a high level of electromagnetic interference (EMI). This phenomena appears to frequently occur as a result of low frequency "beats" which occur between high frequency signals produced in the electronic equipment and ambient high frequency EMI signals sensed by the electronic equipment. In certain circuit applications, such as nuclear reactor control systems and safety systems, and in certain medical electronic devices, such as devices connected to probes used to monitor responses of a patient during open heart surgery, it is imperative that no erroneous signals be produced as a result of sensitivity of circuitry to ambient EMI signals.

Accordingly, it is another object of the invention to provide a low cost, highly reliable isolation amplifier which is very insensitive to ambient EMI signals.

In the past, substantial reductions in the cost of electronic circuitry has often been accomplished by integration of circuit systems or subsystems onto as few monolithic integrated circuit chips as possible. The fact that no highly reliable isolation amplifiers have yet been integratable onto a small number of economically sized integrated circuit chips is reflected in the present high price of presently available isolation amplifiers.

Accordingly, it is another object of the invention to provide a low cost, highly reliable isolation amplifier which can be implemented utilizing only one or two integrated circuit chips.

SUMMARY OF THE INVENTION

Briefly described, and in accordance with one embodiment thereof, the invention provides an isolation amplifier which includes an electrically floating comparator circuit having first and second inputs coupled respectively to first and second inputs of the isolation amplifier. A differential input signal is applied across the first and second inputs of the isolation amplifier. Power for the electrically floating comparator circuit is produced by electrically floating rectifier circuitry which receives a pair of complementary triangular waveform signals from a triangle waveform generating circuit. One of the triangular waveforms generated by the triangle waveform generating circuit is capacitively coupled to one of the imputs of the comparator circuitry, thereby superimposing a triangular signal upon the differential input signal applied to the inputs of the isolation amplifier. Typically, a large common mode signal exists on the first and second inputs of the isolation amplifier. In accordance with the present invention, power is capacitively coupled from the complementary outputs of the triangle waveform generating circuit to a pair of inputs of the floating rectifier circuitry. The rectifier circuitry includes four diode-connected transistors, a filter capacitor, and two floating voltage supply conductors between which the comparator circuit is connected. Two of the diode connected transistors have their collectors and emitters connected to one of the floating voltage conductors, their bases being connected, respectively, to first and second capacitors connected to the outputs of the triangle waveform generator. The other two diode-connected transistors have their collectors and bases connected to the second floating voltage conductor, their emitters being connected, respectively, to the bases of the other two diode-connected transistors. The filter capacitor is connected between the two floating voltage conductors. The first and second inputs to the comparator circuit are coupled by means of resistors to the respective first and second inputs of the isolation amplifier. The comparator circuitry produces a pulse width modulated output signal which represents the differential input signal applied across the first and second inputs of the isolation amplifier. A pulse width demodulator circuit responsive to the output of the comparator circuit produces an analog output signal which is completely free of conductive paths to the inputs of the isolation amplifier. The amplitude of the analog output signal accurately represents the magnitude of the differential input signal applied across the first and second inputs of the isolation amplifier. In one embodiment of the invention, a portion of the second triangular waveform is capacitively coupled to the opposite input of the comparator circuit to which the first triangular waveform is capacitively coupled in order to reduce possible electromagnetic interference produced by the isolation amplifier.

BRIEF DESCRIPTION OF THE DRAWINGS

FIG. 1 discloses a schematic diagram of one embodiment of the invention.

FIGS. 2A and 2B of combination comprises circuits schematic of the triangular waveform generator of the embodiment of the invention shown in FIG. 1.

FIG. 3 discloses a precision switched current source employed in the embodiment of the invention shown in FIG. 1.

FIGS. 4A–4K disclose waveforms which are useful in describing the operation of the circuit of FIG. 1.

DESCRIPTION OF THE INVENTION

Figure 4I:
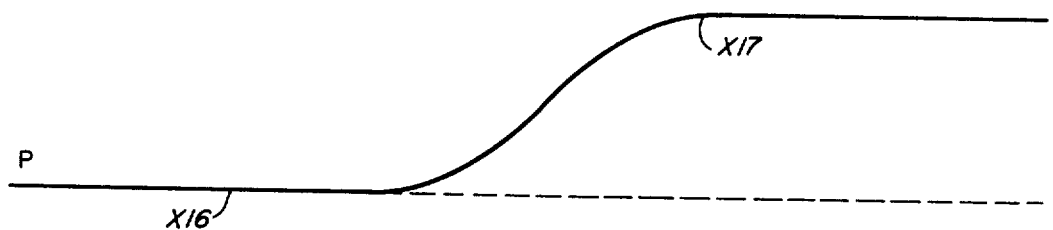

Referring now to FIG. 1, capacitance coupled isolation amplifier 1 includes a one megahertz triangular waveform generator section 3, an electrically floating rectifier section 5, a comparator section 7, and a demodulator section 9. An input difference signal is applied to isolation amplifier 1 between input terminals 11 and 13. It should be noted that while the difference between the voltage on terminals 11 and 13 may be approximately 100 millivolts, the common mode voltage on terminals 11 and 13 may be as high as several kilovolts.

The output of isolation amplifier 1 is produced on output terminal 15. The output signal produced on output terminal 15 is an amplified replica of the difference signal applied between input terminals 11 and 13. The output signal is referenced to the ground voltage on ground conductor 17, and is completely isolated from input terminals 11 and 13 except for negligible amounts of capacitive coupling to input terminals 11 and 13.

Before describing the operation of isolation amplifier circuit 1, it will be helpful to first describe the detailed structure of the above described sections of circuitry. Triangular waveform generator circuitry 3 includes comparator 17, which has its output connected to a switching current sources 18 and 21. The output of precision current source 21 is connected to the input of a high speed inverter circuit 19. The output of inverter 19 is connected to node 23. Feedback resistor 25 is connected between node 23 and the input of comparator 17. The output terminal of switching current source 18 is connected to the input of comparator 17.

A first triangular waveform having an approximately 20 to 25 volt peak-to-peak variation is produced at node 23, and is connected to one terminal of each of capacitors 29 and 31.

A second high speed inverter 37 has its input connected by means of resistor 39 to node 23. A second triangular waveform, which is the compliment of the first triangular waveform on node 23, is produced at node 43, which is connected to the output of inverter 37. The waveform on node 43 also has a 20 to 25 volt peak-to-peak variation. The output of inverter 37 is connected to the input thereof by means of feedback resistor 41. The output of inverter 19 is coupled to the input thereof by means of capacitor 27, whereby inverter 19 and capacitor 27 in combination function as an integrator.

Node 43 is connected to one terminal of each of capacitors 33 and 35.

Those skilled in the art can readily provide the above mentioned components of the circuitry of triangular waveform generator circuitry 3. However, an exemplary alternative circuit for implementing triangular waveform generator 3 (exclusive of capacitors 29, 31, 33, and 35) is shown in FIGS. 2A and 2B, and is subsequently described in detail.

Part of the complementary triangular waveform signals produced on nodes 23 and 43 are coupled by means of capacitors 31 and 35 to conductors 44 and 45, respectively. Conductors 44 and 45 are coupled to floating rectifier circuit 5.

Floating rectifier circuit 5 includes a supply voltage conductor 95 which provides power to comparator circuitry 7. Diode-connected NPN transistor 99 has its collector and emitter connected to conductor 95 and its base connected to conductor 44. Similarly, diode-connected NPN transistor 101 has its emitter and collector connected to node 95 and its base connected to conductor 45. A second floating voltage supply conductor 74 also supplies power to comparator circuitry 7, whereby comparator circuitry 7 is coupled between floating supply voltage conductors 95 and 74.

Diode-connected NPN transistor 102 has its collector and base connected to conductor 74 and its emitter connected to conductor 44. Similarly, diode-connected NPN transistor 103 has its collector and base connected to conductor 74 and its emitter connected to conductor 45.

A large (approximately 100 picofarads) capacitor 97 is connected between floating voltage supply conductors 95 and 74 to eliminate high frequency "ripple" between connectors 95 and 74.

Referring now to comparator section 7, input 11 is connected by means of resistor 51 (which may be approximately 100 kilohms) to node 55. Node 55 is connected to the base of NPN transistor 63. Input 13 is connected by means of resistor 53 (which may be approximately 11 kilohms) to conductor 57.

The triangular waveform produced on node 23 is partially coupled by means of capacitor 29 to conductor 47, which is connected to conductor 57. A portion of the complementary triangular waveform produced on node 43 is coupled by means of capacitor 33 to conductor 49. Conductor 49 is connected to input 13.

Transistor 63 is an emitter follower transistor, having its emitter connected to the collector of constant current source NPN transistor 69. NPN transistors 69, 71, and 73 all have base electrodes connected to conductor 62, which is connected to the base of NPN transistor 93.

The emitters of transistors 69, 71, 73, and 93 are all connected to floating supply conductor 74. Conductor 62 is also connected to the collector of transistor 93. The collector of NPN transistor 93 is connected by means of resistor 91 (which may be approximately 100 kilohms) to input 13 and is also connected to the emitter of NPN transistor 89. The collector of NPN transistor 89 is connected to floating supply voltage conductor 95. The base of NPN transistor 89 is connected to the cathode of diode 87, the anode of which is connected to the cathode of diode 86. The anode of diode 86 is connected to supply voltage conductor 95.

The emitter of NPN transistor 63 is connected to the base of transistor 64. The emitter of transistor 64 is connected to node 67, which is connected to the collector of current source transistor 71. The emitter of transistor 65 is connected to node 67. The base of transistor 65 is connected to the emitter of transistor 66, which is an emitter follower transistor. The emitter of transistor 66 is also connected to the collector of constant current source transistor 73. The base of transistor 66 is connected to conductor 57.

The collectors of emitter coupled transistors 64 and 65 are connected to the respective emitters of NPN transistors 75 and 77, the bases of which are connected to the base of transistor 89 and also to the collector of transistor 63.

Capacitor 59 is coupled between nodes 55 and 13. Capacitor 61 is coupled between nodes 57 and 13. Both capacitors may be approximately 50 picofarads.

The collectors of transistors 75 and 77 are connected, respectively, to conductors 83 and 85. Conductors 83 and 85 are coupled to floating supply voltage conductor 95 by means of resistors 84 and 85' (each of which may be approximately 20 kilohms), respectively.

Diodes 86 and 87 and transistor 89 establish the potential of the floating ground voltage of conductor 13. Resistor 91 and transistor 93 establish a reference voltage to be applied to the bases of current source transistors 69, 71, and 73. Transistors 75 and 77 act to reduce Miller capacitive feedback from the collectors of transistors 64 and 65 to their respective bases.

The demodulator section 9 includes comparator 112, which has first and second inputs connected, respectively, to nodes 109 and 110. Node 109 is coupled by means of resistor 107 to ground conductor 17 and is also connected to one terminal of capacitor 105. The other terminal of capacitor 105 is connected to conductor 85. Node 110 is coupled to ground conductor 17 by means of resistor 108 and is also connected to one terminal of capacitor 106. The other terminal of capacitor 106 is connected to conductor 83.

The output of comparator 112 is coupled to an input of switching precision current source circuit 114, the output of which is connected to node 115. (Switching precision current source circuit may be implemented by means of the circuit shown in FIG. 3). Node 115 is coupled by means of resistor 116 to ground conductor 17 and is also coupled by means of resistor 117 to the positive input of differential amplifier 119. The positive input of differential amplifier 119 is coupled by means of capacitor 118 to ground conductor 17. The output of differential amplifier 119 is connected to output node 15, and is also coupled by means of capacitor 120 to node 115. The output of differential amplifier 119 is also connected to its negative input.

The operation of the circuit of FIG. 1 can be best understood by referring to the timing diagrams of FIGS. 4A–4K. In FIG. 1, the waveforms appearing on nodes 11, 13, 57, 55, 23, 43, 83, 85, 95, and 15 are referred to, respectively, as waveforms A, B, B', F, C, D, J, K, I, and P. The waveform appearing at the output of comparator 112 is referred to as waveform N. The waveform of FIG. 4A, referred to as waveform A, is applied to input node 11, and includes a common mode voltage having a magnitude of several kilovolts. A data signal having a magnitude of several hundred millivolts superimposed on the common mode signal. Of course, the data signal can not be visually detected in waveform A at the scale at which waveform A is drawn in FIG. 4A.

FIG. 4B discloses a common mode "floating ground" voltage, referred to as waveform B, which is applied to node 13 of FIG. 1. The common mode floating ground voltage is equal to the above mentioned common mode voltage of waveform A.

FIG. 4C, referred to as waveform A-B, represents the algebraic difference between waveform A and waveform B. Waveform A-B undergoes a transition from a "high" level to a "low" level at time X1; this difference represents the above mentioned data signal. The magnitude of the difference between waveform A and waveform B is roughly 100 millivolts. Waveform A-B is shown as having high frequency "noise" or "ripple" thereon in FIG. 4C.

FIG. 4D illustrates a waveform referred to as waveform F-B. This waveform represents the voltage difference between the waveform F and waveform B, wherein the high frequency noise appearing on the A-B waveform of FIG. 3C has been filtered out by means of capacitor 59 in FIG. 1. Waveform F-B can be regarded as the input signal to comparator circuitry 7 of FIG. 1.

Figure 4J:
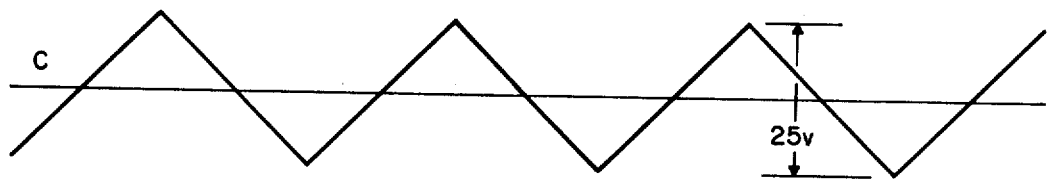
Figure 4K:
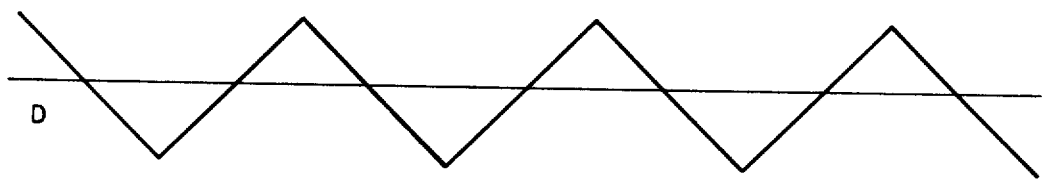

At this point it is useful to refer to FIG. 4J, which shows waveform C. Waveform C is produced at node 23, and is a triangular waveform having a peak-to-peak variation of approximately 25 volts. The waveform of FIG. 4K, referred to as waveform D, appears as node 43 and is the inverse of waveform C, and has precisely the same peak-to-peak variation as waveform C.

Referring now to FIG. 4E, a waveform referred to as waveform B'-B is disclosed. Waveform B'-B appears across resistor 53 in FIG. 1, and is produced as a result of capacitive coupling of waveform C (on conductor 23) to conductors 47 and 57 (which are connected together). Waveform B'-B has a peak-to-peak variation of approximately 400 millivolts. This magnitude is determined by the ratio of capacitor 29 to capacitor 61, and superimposes a 400 millivolt triangular waveform upon the floating ground common mode voltage appearing on node 13.

FIG. 4F discloses a waveform referred to as waveform B'-F, and represents the differential voltage applied across the inputs to the differential comparator including transistors 63, 64, 65, and 66, and therefore represents the difference between waveform B'-B of FIG. 4E and waveform F-B of FIG. 4D. Therefore, waveform B'-F undergoes a transistion at time X1, as shown in FIG. 4F.

Voltage level X5 in FIG. 4F represents the voltage level at which the comparator including transistors 63, 64, 65, and 66 switches states. Points X6, X7, X9, X12, X13, and X14 in FIG. 4F can be referred to as "floating zero" crossing points of waveform B'-F. As will be readily recognized by those skilled in the art, the above mentioned floating zero crossing points determine the transition points of the rectangular waveform which represents the difference between the voltages on conductors 85 and 83 in FIG. 1. FIG. 4G illustrates this waveform, which is the difference between the voltages on nodes 83 and 85, and is referred to as waveform J-K. In accordance with well known pulse width modulation techniques, the width of pulse X8 of waveform J-K corresponds to the above mentioned 100 millivolt signal difference between waveforms A and B prior to transition time X1. The width of pulse X11 in FIG. 4G has an intermediate width resulting from the occurence of the transistion at time X1. The width of pulse X15 and subsequent pulses represents the magnitude of the difference between waveforms A and B after transition X1.

FIG. 4H discloses a waveform, referred to as the waveform N, which appears at the output of comparator 112.

Waveform N is filtered (by means of the circuitry including precision switching current source 114, resistors 117 and 116, capacitors 118 and 120 and differential amplifier 119), thereby producing an analog output waveform referred to as waveform P on node 15. Waveform P is illustrated in FIG. 4I. The lower voltage level X16 of waveform P is produced as the result of the above mentioned filtering of waveform N before transistion time X1. The upper level X17 of waveform P is produced as a result of the above mentioned filtering of waveform N after transistion time X1. Thus, waveform P is a highly accurate, (although inverted) representation of waveform A-B of FIG. 4C. Waveform P is referenced to the voltage of ground conductor 17, and has amplitude determined by resistor 116, the magnitude of current source 114 and the triangular voltage uniform process comparator 61. Further, waveform P is highly isolated from waveform A-B, as is necessary for an isolation amplifier.

Referring now to FIGS. 2A and 2B, (which show exemplary circuitry for implementing triangular waveform circuitry 3 of FIG. 1) conductor 49 (to which waveform C is capacitively coupled) is connected to the emitter of NPN transistor 130, which has its collector connected to voltage supply conductor 125. Transistor 130 has its base connected to the collector of PNP transistor 128 and the anode of diode 134. Transistor 128 has its emitter connected to voltage conductor 125 and its base connected to the emitter of PNP transistor 124, transistor 124 has its collector connected to voltage conductor 127 and its base connected to conductor 133. Diode 134 has its cathode connected to the anode of diode 136, which has its cathode connected to both the cathode of diode 132 and the collector of NPN transistor 138. The anode of diode 132 is connected to conductor 49. The emitter of transistor 138 is connected to voltage conductor 127.

The base of transistor 138 is connected to both the cathode of diode 142 and one terminal of one of resistor 144'. Resistor 144' has its other terminal connected to voltage conductor 127. The anode of diode 142 is connected to the emitter of NPN transistor 140, which has its collector connected to voltage conductor 125. Transistor 140 has its base connected to one terminal of capacitor 158, the collector of NPN transistor 188, and the collector of NPN transistor 178. The other terminal of capacitor 158 is connected to conductor 49, which is also connected to the cathode of zener diode 160. Zener diode 160 has its anode connected to the collector of NPN transistor 206.

Transistor 178 has its emitter coupled by means of resistor 180 to voltage conductor 127 and its base connected to the emitter of NPN transistor 172. NPN transistor 172 has its collector connected to voltage conductor 125 and its base connected to the collector of NPN transistor 174. Transistor 174 has its emitter coupled by means of resistor 182 to voltage conductor 127. The emitter of transistor of 172 is also connected to the bases of NPN transistors 191, 190, 204, and 208, all of which have their respective emitters connected to voltage conductor 127 by means of resistors 184, 200, 202, and 210, respectively.

The base of NPN transistor 172 is coupled by means of resistor 164 to the base of PNP transistor 150 and the collector of NPN transistor 146. Transistor 146 has its emitter coupled by means of resistor 147 to voltage conductor 125. Transistor 146 has its base connected to the bases of PNP transistors 144 and 148. Transistors 144 and 148 have their emitters coupled to voltage conductor 125 by means of resistors 151 and 149, respectively.

Transistor 150 has its collector connected to voltage conductor 127 and its emitter connected to the base of transistor 146.

The collector of PNP transistor 144 is connected to the collector of transistor 188 and is connected to the junction between resistors 152 and 154. The other terminal of resistor 152 is connected to conductor 49. The other terminal of resistor 154 is connected to one terminal of capacitor 234, the other terminal of which is connected to both the collector of NPN transistor 186 and the base of NPN transistor 236.

NPN transistor 162 has its base connected to the anode of zener diode 160 and its collector connected to conductor 157. Conductor 157 is connected to the emitter of NPN transistor 220. NPN transistor 220 has its collector connected to voltage conductor 125 and its base connected to a voltage reference circuit including resistors 222, diodes 224, 226, 228, and 230, and resistor 232, all of which are coupled in series between voltage conductors 125 and 127. The emitter of NPN transistor 162 is coupled by means of resistor 166 and capacitor 168 (which are connected in parallel) to the collector of transistor 191 and the base of NPN transistor 170. The collector of transistor 170 is connected by means of resistor 156 to conductor 157 and is also connected to the base of NPN transistor 216. Transistor 216 has its collector connected to conductor 157 and its emitter coupled by means of resistor 212 and capacitor 214 (which are connected in parallel) to the base of NPN transistor 206. Transistor 206 has its collector connected to both the base of transistor 162 and one terminal of resistor 218. The other terminal of resistor 218 is connected to conductor 157.

The emitters of transistors 170 and 206 are connected to the collector of transistor 204. The base of transistor 216 is connected to the anode of zener diode 161. The cathode of zener diode 161 is connected to conductor 47 and to one terminal of capacitor 234. The other terminal of capacitor 234 is connected to both the collector of NPN transistor 186 and the base of NPN transistor 236. The base of transistor 188 is connected to the base of transistor 206. The emitter of transistor 186 and the emitter of transistor 188 are connected to the collector of transistor 190.

The emitter of transistor 236 is connected to the anode of diode of 238, the cathode of which is connected to the base of NPN transistor 248. The cathode of diode 238 is coupled by means of resistor 240 to voltage conductor 127. The collector of transistor 236 is connected to voltage conductor 125. The emitter of transistor 248 is connected to voltage conductor 127. The collector of transistor 248 is connected to the cathodes of diodes 246 and 250. The anode of diode 250 is connected to both conductor 47 and the emitter of NPN transistor 242. The collector of transistor 242 is connected to voltage conductor 125. The base of transistor 242 is connected to both the collector of PNP transistor 252 and the anode of diode 244. The cathode of diode 244 is connected to the anode of diode 246. The emitter of PNP transistor 252 is connected to voltage conductor 125. The base of transistor 252 is connected to the emitter of PNP transistor 124.

In operation the triangular waveform circuit of FIGS. 2A and 2B produces waveforms C and D such that there is very little delay between complimentary waveforms C and D by following a somewhat different approach than that indicated in circuitry 3 of FIG. 1. It is desirable to eliminate such delay to obtain maximum power transfer across capacitors 31 and 35 in FIG. 1 and also to minimize possible EMI produced by the circuitry of FIG. 1.

The operation of the triangle waveform generating circuitry of FIGS. 2A and 2B can be better understood if it is first recognized that the portions of circuitry included in dotted line sections 311 and 312 act as integrators, capacitors 158 and 234 functioning as integrator capacitors and the remaining circuitry in sections 311 and 312 functioning essentially as crude operational amplifiers.

As will subsequently become clear, the lower portions of each of triangular waveforms C and D trigger circuitry in FIGS. 2A and 2B, causing a change of state in latch-like circuitry therein. The change of state changes the directions of the slopes of the output waveforms C and D, which are produced on conductors 23 and 43, respectively.

It will be assumed, for the following discussion, that PNP transistors 144 and 148 function as 800 microampere and 400 microampere constant current sources. NPN transistors 178, 191, 190, 204, and 208 function as constant current sources of 400, 200, 200, 400, and 200 microamperes, respectively.

It will further be assumed that initially transistor 248 is on, causing discharging of capacitor 234, and thereby causing waveform C to fall.

Under these conditions, transistors 186 and 170 are off, and transistors 188 and 206 are on. Transistor 188 then tends to turn off transistor 140. This causes transistor 138 to be off, and transistor 130 is on, charging up capacitor 158 and thereby causing waveform D to rise.

Since transistor 170 is off and transistor 206 is on, resistor 156 pulls the base of transistor 216 to a higher voltage than the base of transistor 162.

As waveform C continues to fall, it reaches a level (determined by voltage drop across resistor 232 and the algebraically summed voltage drops across diodes 230, 228, 226, 224, the base emitter junction of transistor 220, and Schottky diode 161) which turns Schottky diode 161 on. This lowers the voltage of the emitter of transistor 216, which lowers the base voltage of transistors 206 and 188. This turns off transistors 206 and 188, causing transistors 170 and 186 to turn on.

When transistor 188 turns off, transistor 140 turns off, causing transistor 138 to turn off, reversing the slope of waveform D. When transistor 186 turns on, the base voltage of transistor 236 is lowered, turning transistor 248 off, allowing transistor 242 to turn on and begin charging capacitor 234 toward +V. Thus, the direction of the slope of waveform C is also reversed.

It should be recognized that transistors 170 and 206, in conjunction with resistors 156 and 218 and transistors 162 and 216, function as a latch which changes state each time the lower portions of waveforms C and D cause Schottkey diodes 161 and 160, respectively, to be turned on. The directions of the slope of waveforms C and D remain relatively constant between changes of state of the above mentioned latching circuitry. Each time the latching circuitry changes state, the directions of the slopes of waveforms C and D are substantially reversed, with substantially less delay than would occur for the circuitry shown in section 3 of FIG. 1.

I claim:

1. An isolation amplifier for producing an isolated output signal in response to a differential input signal, said isolation amplifier comprising in combination:
   a. first means for producing first and second signals each having a triangular wave shape, said first and second signals being substantially complementary;
   b. floating power supply means for producing an electrically floating D C voltage difference;
   c. first and second coupling means for capacitively coupling first portions of said first and second signals, respectively, to said floating power supply means; and
   d. input circuit means receiving operating power from said floating power supply means for receiving and operating upon said differential input voltage, said input circuit means being electrically floating.

2. The isolation amplifier of claim 1 wherein said input circuit means includes a comparator circuit having first and second inputs responsive to said differential input signal.

3. The isolation amplifier of claim 2 including a first capacitor having first and second electrodes, said first electrode being coupled to the output of said first means to receive said first signal, and said second electrode being coupled to the first input of said comparator circuit, to cause a portion of said first signal to be superimposed on said differential input signal.

4. The isolation amplifier of claim 3 wherein said comparator circuit produces a pulse width modulated output signal in response to said portion of said first signal superimposed on said first differential input signal, said isolation amplifier further including pulse width demodulator means responsive to said output of said comparator circuit for producing an output signal isolated from said differential input signal, said output signal of said pulse width demodulator means having a magnitude accurately representative of the amplitude of said differential input signal.

5. The isolation amplifier of claim 4 further including a second capacitor having a first electrode coupled to said first means for receiving said second signal, said second capacitor having a second electrode coupled to the second input of said comparator circuit to offset any ripple voltage coupled to the second input of said comparator circuit in response to said first signal.

6. The isolation amplifier of claim 4 wherein said first coupling means includes a third capacitor having a first electrode connected to said first means to receive said first signal, said third capacitor having a second electrode connected to said floating power supply means to deliver power from said first means to said floating power supply means, the first electrode of said third capacitor being connected to the first electrode of said first capacitor, said second coupling means including a fourth capacitor having a first electrode connected to the output of said first means to receive said second signal, said fourth capacitor having a second electrode connected to said floating power supply means to deliver power to said floating power supply means.

7. The isolation amplifier of claim 6 wherein said floating power supply means includes first, second, third, and fourth rectifying means and first and second floating voltage conductors between which said comparator circuit is connected, said electrically floating D C voltage difference being produced between said first and second floating voltage conductors, said first and second rectifying means being coupled between said first floating voltage supply conductor and said second electrodes of said third and fourth capacitors, respectively, said third and fourth rectifying means being coupled between said second floating voltage conductor and the second electrodes of said third and fourth capacitors, respectively.

8. The isolation amplifier of claim 7 wherein said floating power supply means includes a fifth capacitor coupled between said first and second floating voltage conductors to filter said electrically floating D C voltage difference.

9. The isolation amplifier of claim 7 wherein said differential input signal is coupled across the first and second inputs of said comparator circuitry by means of first and second resistors.

10. A method of operating isolation amplifier circuitry to produce an isolated output signal, the isolation amplifier circuitry including electrically floating circuitry for receiving and operating upon the differential input voltage, said method comprising the steps of:
 a. producing a first signal having a triangular wave shape;
 b. capacitively coupling a first portion of said first signal to an electrically floating power supply circuit;
 c. producing an electrically floating D C voltage difference by means of the electrically floating power supply; and
 d. applying said electrically floating D C voltage difference to the electrically floating circuitry.

11. The method of claim 10 wherein said electrically floating circuitry includes comparator circuitry, said method including the step of coupling the differential input signal to the inputs of the comparator circuitry, wherein step (b) includes capacitively coupling a second portion of said first signal to an input of the comparator circuitry.

12. The method of claim 11 wherein said differential input voltage is the voltage difference between first and second input conductors of the isolation amplifier circuitry, the first input conductor having an electrically floating reference potential thereon, said step (b) including superimposing said second portion of said first signal on said electrically floating reference potential.

13. The method of claim 12 further including the step of coupling the differential signal resulting from said superimposing across the inputs of the comparator circuitry.

14. The method of claim 13 further including producing a second signal having a triangular wave shape in response to said first signal, said second signal being substantially 180 degrees out of phase with said first signal, said method including the step of capacitively coupling a first portion of said second signal to the electrically floating power supply circuit.

15. The method of claim 14 including the step of capacitively coupling a second portion of said second signal to the first input conductor of the isolation amplifier circuitry, to produce a cancellation signal on the first conductor of the isolation amplifier circuitry.

16. A method of operating amplifier circuitry to amplify a differential input signal applied to first and second inputs of the amplifier circuitry to produce an output signal which is isolated from the differential input signal, the first input having a floating ground voltage level thereon, the amplifier circuitry including
 i. comparator circuitry having first and second inputs coupled, respectively, to the first and second inputs of the amplifier circuitry and also having first and second outputs, the comparator circuitry being electrically floating,
 ii. power supply circuitry for supplying electrical power to the comparator circuitry, the power supply circuitry also being electrically floating, and
 iii. demodulator circuitry coupled to the first and second outputs of the comparator circuitry to demodulate a pulse width modulated output produced at the first and second outputs of the comparator circuitry, the demodulator circuitry having an output at which the output signal of the amplifier circuitry is produced,
said method comprising the steps of:
 a. producing a triangular waveform signal;
 b. capacitively coupling a portion of said triangular waveform signal to the power supply circuitry to provide operating power for the power supply circuitry;
 c. capacitively coupling a portion of said triangular waveform signal to a first conductor, the first conductor being electrically coupled to one of the first and second input nodes of the amplifier circuitry, hereby superimposing the portion of the triangular waveform signal capacitively coupled to the first conductor onto the differential input voltage;
 d. producing a pulse width modulated output signal between the first and second outputs of the comparator circuitry in response to said superimposing, said pulse width modulated output signal representing the magnitude of the differential input signal; and
 e. demodulating the pulse width modulated output signal to produce the output signal of the amplifier circuitry, the output signal of the amplifier circuitry being an amplified version of the differential output signal and being isolated from the differential input signal.

* * * * *